U S 0 1 1 3 6 1 2 3 6 B 2

US011361236B2

(12) United States Patent
Rule et al.

(10) Patent No.: US 11,361,236 B2
(45) Date of Patent: Jun. 14, 2022

(54) ENSEMBLE FORECAST STORM DAMAGE RESPONSE SYSTEM FOR CRITICAL INFRASTRUCTURE

(71) Applicant: Florida Power & Light Company, Juno Beach, FL (US)

(72) Inventors: Brick Rule, Port Charlotte, FL (US); Iliana M. Rentz, Miramar, FL (US); Timothy D. Drum, Wellington, FL (US); William M. Dorr, Jupiter, FL (US); Paul R. Hynes, Jupiter, FL (US); Jeffrey D. Dubs, North Palm Beach, FL (US); Andrew W. Kirby, Jupiter, FL (US); Steven J. Palmieri, Plantation, FL (US); Eduardo R. Devarona, Jupiter, FL (US)

(73) Assignee: FLORIDA POWER & LIGHT COMPANY, Juno Beach, FL (US)

( * ) Notice: Subject to any disclaimer, the term of this patent is extended or adjusted under 35 U.S.C. 154(b) by 1071 days.

(21) Appl. No.: 15/948,489

(22) Filed: Apr. 9, 2018

(65) Prior Publication Data

US 2019/0311280 A1  Oct. 10, 2019

(51) Int. Cl.
*G06N 7/00* (2006.01)
*G01W 1/10* (2006.01)
*G06F 30/20* (2020.01)

(52) U.S. Cl.
CPC .............. *G06N 7/005* (2013.01); *G01W 1/10* (2013.01); *G06F 30/20* (2020.01)

(58) Field of Classification Search
CPC .......... G06N 7/005; G06F 30/20; G01W 1/10
See application file for complete search history.

(56) References Cited

U.S. PATENT DOCUMENTS

| 5,835,386 A | 11/1998 | Orr et al. |
| 7,010,437 B2 | 3/2006 | Lubkeman et al. |
| (Continued) | | |

FOREIGN PATENT DOCUMENTS

CN          103440400 A    * 12/2013

*Primary Examiner* — Tarun Sinha
*Assistant Examiner* — Yossef Korang-Beheshti
(74) *Attorney, Agent, or Firm* — Tarolli, Sundheim, Covell & Tummino LLP (57) ABSTRACT

A storm damage response system includes a storm ensemble database that stores ensemble forecast models associated with respective potential storm paths of a given storm across a geographic area and an equipment database that stores equipment data associated with location and characteristics of power-providing equipment in the geographic area. A storm damage model algorithm generates a storm response plan comprising an operational procedure for repairing or maintaining power transmission and distribution electric systems to mitigate storm damage impact based on generating a probabilistic model for each of the ensemble forecast models based on the equipment data and calculating a statistical impact value associated with the probabilistic model based on an aggregate of iterative probabilistic simulations for the respective ensemble forecast model. The storm response plan can be generated based on the relative statistical impact value of the probabilistic model of each of the ensemble forecast models.

18 Claims, 4 Drawing Sheets

(56) References Cited

U.S. PATENT DOCUMENTS

2007/0168155 A1* 7/2007 Ravela ................... G06Q 10/04
  702/179
2016/0343093 A1* 11/2016 Riland ................... G06Q 10/04
2018/0156940 A1* 6/2018 Altschule ................ G01W 1/02

* cited by examiner

ENSEMBLE FORECAST STORM DAMAGE RESPONSE SYSTEM FOR CRITICAL INFRASTRUCTURE

TECHNICAL FIELD

This disclosure relates generally to transmission and distribution electric systems, and more specifically to a storm damage response system.

BACKGROUND

Catastrophic storms such as hurricanes and tropical storms have wreaked significant devastation on peoples' homes and the supporting infrastructure. Most such storms are forecasted, but typically only a few days before the storm makes landfall. While the storm is forecasted, the ability to accurately predict the path that the storm will travel over the course of more than a few hours can be illusive. Additionally, the power of the storm may be such that significant damage is inevitable to homes, commerce buildings, and other critical infrastructure such as the electric power grid and its power-providing equipment (e.g., power stations, utility transformers, utility poles and power lines) even with modern building and construction techniques. As a result, it is very difficult to prepare for the evacuation and inevitable damage prior to the storm making landfall. Additionally, the unpredictable nature of a catastrophic storm renders it also very difficult to prepare for and conduct recovery efforts to restore the infrastructure to allow people to return to their homes.

SUMMARY

One example includes a storm damage response system. The storm damage response system includes a storm ensemble database that stores ensemble forecast models associated with respective potential storm paths of a given storm across a geographic area and an inventory database that stores inventory data associated with location and characteristics of power-providing equipment and characteristics of a consumer population in the geographic area. A storm damage model algorithm generates a storm response plan comprising an operational procedure for repairing or maintaining the transmission and distribution electric systems to mitigate storm damage impact based on generating a probabilistic model for each of the ensemble forecast models based on the inventory data and calculating a statistical impact value associated with the probabilistic model based on an aggregate of iterative probabilistic simulations for the respective ensemble forecast model. The storm response plan can be generated based on the relative statistical impact value of the probabilistic model of each of the ensemble forecast models.

Another example includes a method for generating a storm response plan comprising an operational procedure for repairing or maintaining the transmission and distribution electric systems to mitigate storm damage impact. The method includes providing a plurality of ensemble forecast models associated with respective potential storm paths of a given storm across a geographic area via a storm ensemble database and providing inventory data associated with location and characteristics associated with power-providing equipment and characteristics of a consumer population in the geographic area with respect to the transmission and distribution electric systems via an inventory database. The method also includes generating a probabilistic model for each of the plurality of ensemble forecast models. The probabilistic model includes probabilistic data associated with operational failure of the power-providing equipment, as defined by the inventory data, based on a portion of the geographic area that is associated with the potential storm path of the respective one of the plurality of ensemble forecast models. The method also includes implementing a plurality of iterative probabilistic simulations for the probabilistic model associated with each of the plurality of ensemble forecast models and calculating a statistical impact value associated with the probabilistic model associated with each of the plurality of ensemble forecast models. The method further includes generating the storm response plan based on the relative statistical impact value of the probabilistic model of each of the plurality of ensemble forecast models and publishing the storm response plan to at least one organization associated with the transmission and distribution electric systems to disseminate at least a portion of the operational procedure to each of the at least one organization.

Another example includes a storm damage response system. The system includes a storm ensemble database configured to store a plurality of ensemble forecast models associated with respective potential storm paths of a given storm across a geographic area and an inventory database configured to store inventory data associated with location and characteristics associated with power-providing equipment and characteristics of a consumer population in the geographic area with respect to the transmission and distribution electric systems. The system further includes a storm damage model control system configured to implement a storm damage model algorithm to generate a storm response plan comprising an operational procedure for repairing or maintaining the transmission and distribution electric systems to mitigate storm damage impact. The storm damage model algorithm can be configured to generate a probabilistic model for each of the plurality of ensemble forecast models based on a predetermined percentage of failure of each of the at least a portion of the power-providing equipment with respect to the given storm, and to calculate a statistical impact value associated with the probabilistic model based on an aggregate of a plurality of iterative probabilistic simulations for the probabilistic model associated with the respective one of the plurality of ensemble forecast models. The storm damage model control system can be configured to generate the storm response plan based on the relative statistical impact value of the probabilistic model of each of the plurality of ensemble forecast models. The storm response plan can include an operational level response plan comprising geographic-based resource allocation and inventory repair action plans and an executive level response plan comprising a total resource cost and a timeline for providing recovery for affected customer outages resulting from the storm damage impact with respect to the transmission and distribution electric systems.

DETAILED DESCRIPTION

This disclosure relates generally to the transmission and distribution electric system, and more specifically to a storm damage response system. After detection of the formation of a storm, such as a hurricane, one or more weather forecasting services can provide information regarding ensemble forecast models that can each correspond to a potential path of the storm across a geographic area, as well as characteristics of the storm (e.g., wind speed and/or precipitation). The ensemble forecast models can be saved in a database, and can be frequently updated via the weather forecasting service(s). Additionally, an inventory database can store inventory data associated with power-providing equipment associated with one or more transmission and distribution electric systems. As an example, the power-providing equipment can include power stations, utility transformers, utility poles, power lines, and any of a variety of other equipment for generating and distributing power to consumers in the geographic area that can be potentially affected by the storm. As an example, the inventory data can also include maintenance data associated with the power-providing equipment from which percentage probabilities of failure can be assigned over a range of characteristics of a given storm.

A storm damage model control system can be configured to generate a storm response plan based on the ensemble forecast model and based on the inventory data. As an example, for each of the ensemble forecast models, the storm damage model control system can implement a storm damage model algorithm that can generate a probabilistic model for each of the ensemble forecast models based on a predetermined percentage of failure of the power-providing equipment with respect to the given storm based on the inventory data. The storm damage model algorithm can also implement iterative probabilistic simulations for the probabilistic model to calculate a statistical impact value associated with the probabilistic model (e.g., based on an aggregate of the iterative probabilistic simulations for the probabilistic model). The storm damage model control system can thus evaluate the statistical impact value associated with each of the ensemble forecast models to generate the storm response plan, such as accounting for timeline, cost, and/or efficiency.

Figure 1:
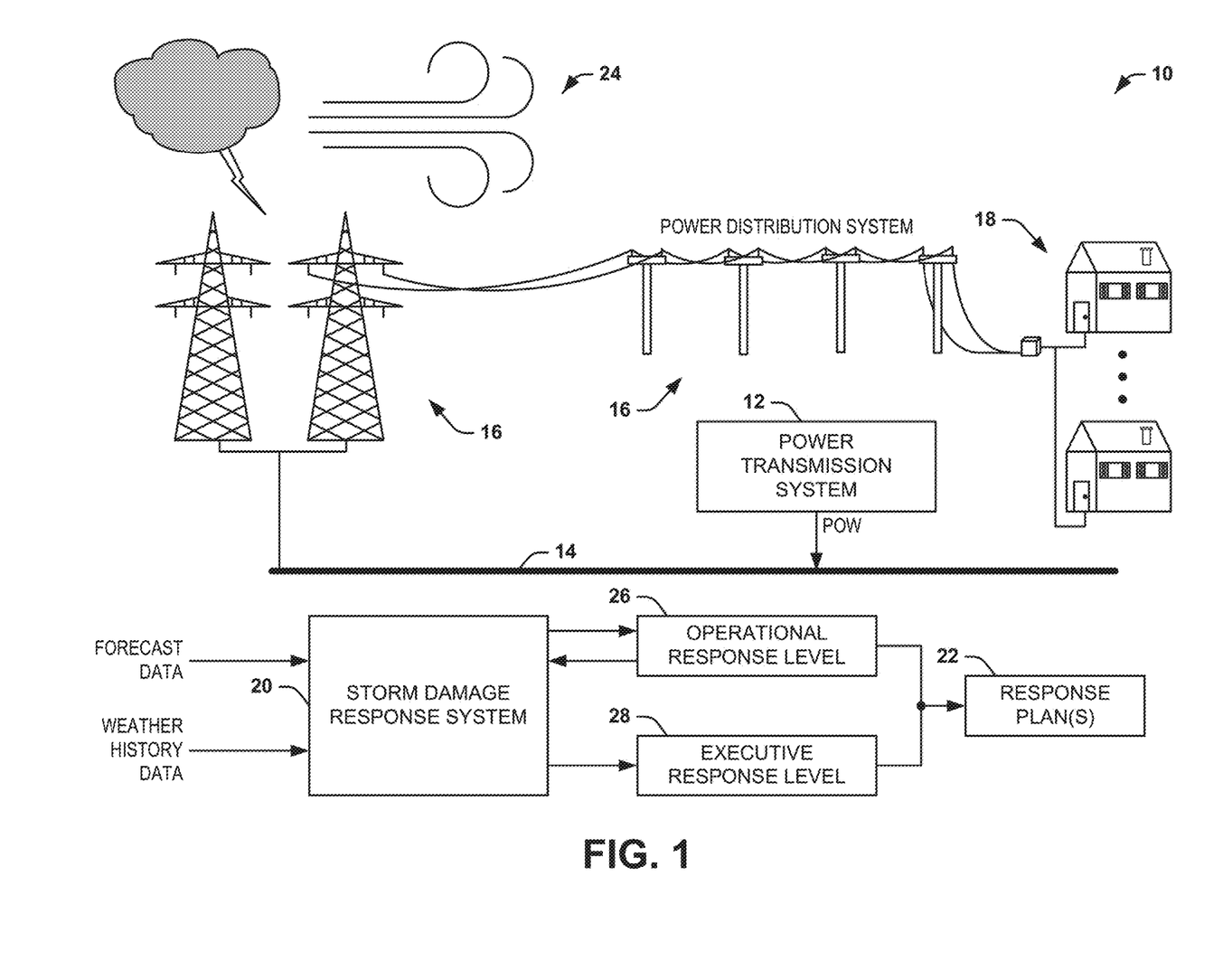
FIG. 1 illustrates an example of a utility power system.

A storm damage response system can be implemented in any of a variety of utility power systems, such as demonstrated in the example of FIG. 1. FIG. 1 illustrates an example of a utility power system 10. The utility power system 10 includes a power generator system 12 that is configured to provide generator power, demonstrated in the example of FIG. 1 as POW, to a power transmission system 14, which can correspond to a power bus or point-of-interconnect (POI) that provides power via power-providing equipment 16 (e.g., transformers and power lines) to consumers, demonstrated generally at 18. In the example of FIG. 1, the power generator system 12 can be arranged as any of a variety of power generator systems, such as fossil-fuel power, wind power, solar power, or battery power.

In addition, the utility power system 10 includes a storm damage response system 20 that is configured to generate one or more storm damage response plans 22 that correspond to an operational procedure for repairing or maintaining the power generator systems to mitigate damage impact resulting from a storm 24. In the example of FIG. 1, the storm damage response system 20 can receive forecast data or weather history data, such as from a weather forecasting service, that can correspond to ensemble forecast models of an incoming storm (e.g., the storm 24) or to characteristics of a historical storm or a simulated storm. The storm damage response system 20 can thus generate the storm damage response plan(s) 22 that can correspond to subsequently repairing the damage of the incoming storm 24 or can correspond to maintaining the power generator system 12, the power transmission system 14, and/or the power-providing equipment 16 in a preventative manner.

Additionally, the storm damage response system 20 can be configured to generate the storm damage response plan(s) 22 at an operational response level 26 and an executive response level 28. For example, the operational response level 26 can correspond to multiple storm damage response plans that correspond to the respective ensemble model forecasts of the storm 24, and can include geographic-based resource allocation and inventory repair action plans. As another example, the executive response level 28 can correspond to an aggregate of the operational response level plans 26, and can include a total estimated resources and an estimated timeline for providing recovery for affected customer outages resulting from the storm damage impact with respect to the transmission and distribution electric systems.

Figure 2:
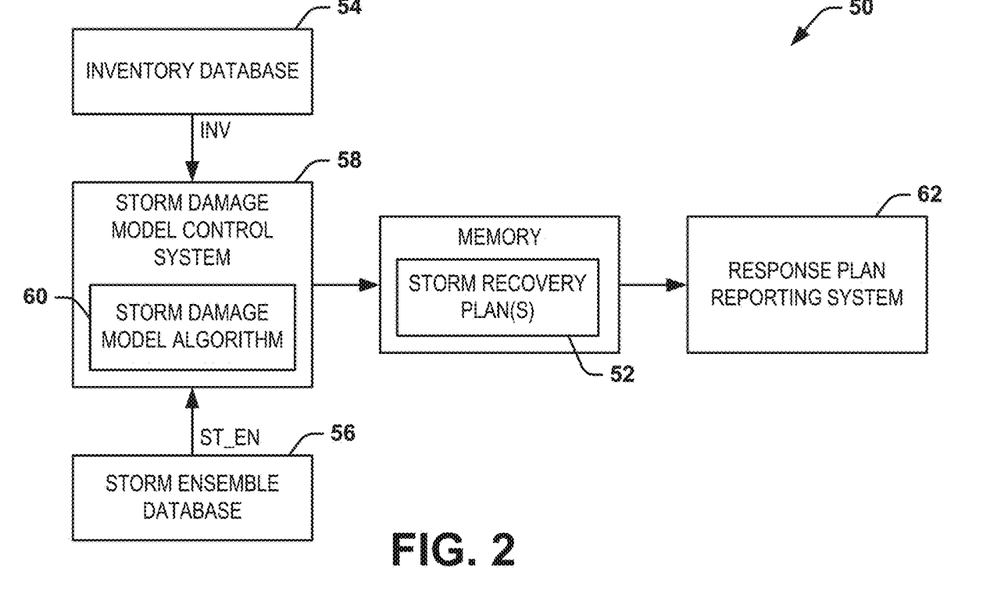
FIG. 2 illustrates an example of a storm damage response system.

FIG. 2 illustrates an example of a storm damage response system 50. The storm damage response system 50 can correspond to the storm damage response system 20 in the example of FIG. 1, and can thus generate one or more storm damage response plans 52 that correspond to an operational procedure for repairing or maintaining transmission and distribution electric systems to mitigate damage impact resulting from a storm.

The storm damage response system 50 includes an inventory database 54 that is configured to store inventory data associated with power-providing equipment associated with one or more transmission and distribution electric systems. As an example, the power-providing equipment can include power stations, and can also include utility transformers and/or power lines (e.g., the power transmission system 14, and/or the power-providing equipment 16), and any of a variety of other equipment for generating and distributing power to consumers in the geographic area that can be potentially affected by the storm. The inventory database 54 can also include a variety of characteristics associated with the power-providing equipment, such as including maintenance data associated with the power-providing equipment. The maintenance data can correspond to information as to when a given set of power-providing equipment was last repaired or maintained, a current state of repair, and/or a proximity or relationship with other features of the geographic area (e.g., proximity to trees, mobile homes, water features, or other features that may be more susceptible or relevant to storm damage). As yet another example, the inventory data can also store information regarding the effects of prior storms, such as to account for already damaged portions of the power-providing equipment or associated geographic features, such that the changes to the power-providing equipment or associated geographic features can affect the anticipated damage of the storm.

As an example, as described in greater detail herein, the power-providing equipment can be assigned probabilistic data that is associated with percentage probabilities of failure over a range of characteristics of a hypothetical storm (e.g., wind speed and/or direction, precipitation levels, or other characteristics of the storm). For example, the percentage probabilities of failure of the power-providing equipment can be assigned in a predetermined manner based on the maintenance data, and can thus change over the range of the characteristics of the hypothetical storm. For example, the probabilistic data can be assigned as a single probability or a range of probabilities for each of a set of tiers of storm conditions (e.g., range of wind speeds and/or precipitation). Therefore, the inventory data in the inventory database 54 can include the probabilistic data as an appended tag to the power-providing equipment described in the inventory data. In the example of FIG. 2, the inventory database 54 is demonstrated as providing the inventory data, demonstrated as "INV", to a storm damage model control system 56.

The storm damage response system 50 also includes a storm ensemble database 58. The storm ensemble database 58 is configured to store ensemble forecast models associated with respective potential storm paths of a given storm across the geographic area. For example, the storm ensemble database 58 can be provided the ensemble forecast models from one or more weather forecasting services, and can be updated by the weather forecasting service(s) based on observed changes to the storm. As an example, the ensemble forecast models can include information regarding potential paths of the storm across the geographic area, as well as characteristics of the storm (e.g., wind speed and/or precipitation). In the example of FIG. 2, the storm ensemble database 58 is demonstrated as providing the ensemble forecast models, demonstrated as "ST_EN", to the storm damage model control system 56.

Figure 3:
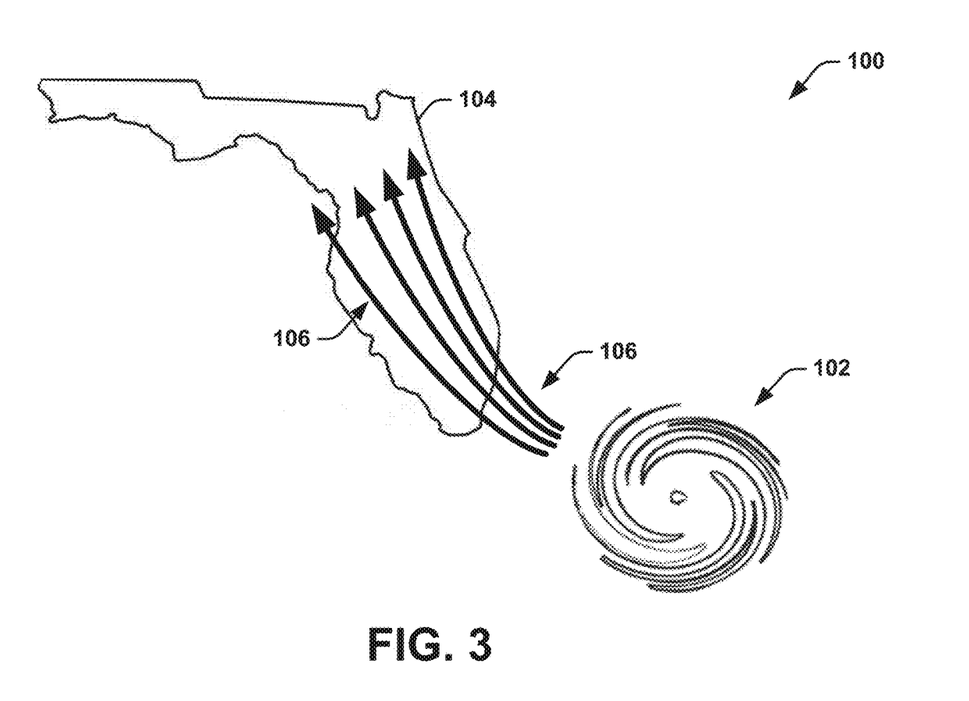
FIG. 3 illustrates an example diagram of ensemble forecast models of a storm.

FIG. 3 illustrates an example diagram 100 of ensemble forecast models of a storm 102. In the example of FIG. 3, the storm is demonstrated as a hurricane that is located off the coast of the state of Florida, demonstrated diagrammatically at 104. As an example, in response to detection of the formation of the storm 102, such as before achieving classification as a hurricane, the associated weather forecasting service(s) can provide one or more ensemble forecast models to the storm damage response system 50. In the example of FIG. 3, the ensemble forecast models are demonstrated as arrows 106 that demonstrate potential paths of the storm 102 across the geographic area of Florida 104.

As an example, the weather forecasting service(s) can provide a set of initial ensemble forecast models 106, and can periodically update the ensemble forecast models 106 based on perceived changes to the storm. The ensemble forecast models 106 can include not only the potential paths of the storm 102, but can also include data associated with the storm 102, such as wind speed, speed of the storm (e.g., along the storm path), precipitation, and/or a variety of other characteristics of the storm 102. Additionally, the data regarding the characteristics of the storm 102 can differ from one ensemble forecast model to the other, such as based on known effects of geographic features of the geographic region (e.g., mountains) on the storm 102. As described herein, the storm damage response system 50 can generate the storm response plan(s) based on the set of ensemble forecast models of the storm 102.

As another example, the ensemble forecast models 106 can correspond to historical storms that have already occurred. As an example, the historical storm data can be implemented to simulate the effects of a storm in generating the storm damage response plan(s) 52 and/or can be implemented to estimate the probabilities of failure of the power-providing equipment described by the inventory data in the inventory database 54. As yet another example, the ensemble forecast models 106 can correspond to simulated storms that can be implemented to simulate the effects of a storm in generating the storm damage response plan(s) 52. As an example, the simulated storms represented by the ensemble forecast models 106 can be implemented to generate the storm damage response plan(s) to determine an operational maintenance plan for determining which portions of the power-providing equipment might be most vulnerable to damage from a potential storm. The storm damage response plan(s) can thus correspond to a preventative maintenance action plan for making cost-effective repairs to the power-providing equipment that can potentially mitigate more costly repairs that would be required after significant damage caused by a real storm.

Referring back to the example of FIG. 2, the storm damage model control system 56 is configured to implement a storm damage model algorithm to generate the storm damage response plan(s) 52 based on the inventory data INV and the ensemble forecast models ST_EN. In the example of FIG. 2, the storm damage response plan(s) 52 are stored in a memory 60. The memory 60 is accessible by a response plan reporting system 62 that is configured to publish the storm damage response plan(s) 52 to a predetermined set of organizations associated with the power system(s) to disseminate at least a portion of the operational procedure to each of the organizations, as described in greater detail herein. As a result, each of the respective organizations can act upon respective portions of the storm damage response plan(s) 52 to contribute to the operational procedure for mitigating the effects of the storm damage and/or to restore the power system(s) and associated power-providing equipment back to normal operating conditions.

Figure 4:
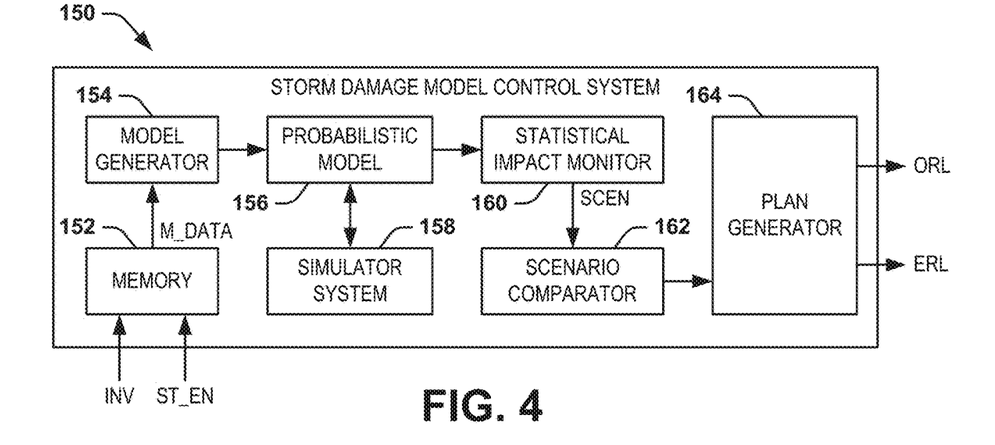
FIG. 4 illustrates an example of a storm damage model control system.

FIG. 4 illustrates an example of a storm damage model control system 150. The storm damage model control system 150 can correspond to the storm damage model control system 56 in the example of FIG. 2. Therefore, reference is to be made to the example of FIGS. 2 and 3 in the following description of the example of FIG. 4.

The storm damage model control system 150 includes a memory 152 that is configured to store the received inventory data INV and the ensemble forecast models ST_EN, such as provided from the inventory database 54 and the storm ensemble database 58, respectively. The storm damage model control system 150 also includes a model generator 154 that is configured to generate a probabilistic model, demonstrated at 156, associated with the storm (e.g., incoming actual storm, historical storm, or simulated storm). As an example, the probabilistic model 156 can be stored in a memory, such as the memory 152. In the example of FIG. 4, the model generator 154 accesses model data M_DATA from the memory 152 to generate the probabilistic model 156. As an example, the model data M_DATA can include a single one of the ensemble forecast models associated with a single potential path of the storm (e.g., one of the ensemble forecast models 106), and can also include a set of the inventory data INV that includes the inventory (power generator system(s) and/or power-providing equipment) that is predicted to be affected by the storm with respect to the respective ensemble forecast model. Therefore, the probabilistic model 156 can correspond to one probabilistic model of a plurality of probabilistic models, each of the plurality of probabilistic models corresponding to a respective one of the ensemble forecast models and being associated with a respective set of the inventory data.

Upon generating the probabilistic model 156, the storm damage model control system 150 can implement a plurality of iterative probabilistic simulations on the probabilistic model 156. In the example of FIG. 4, the storm damage model control system 150 includes a simulator system 158 which can be configured as a software module that is configured to run the plurality of iterative probabilistic simulations on the probabilistic model 156. As an example, the simulator system 158 can implement a predetermined number of simulations, such as Monte Carlo simulations, to provide a set of potentially different outcomes with respect to failures of the power-providing equipment described by the set of inventory data of the probabilistic model 156.

For example, as described previously, the inventory data can be assigned probabilistic data that is associated with percentage probabilities of failure over a range of characteristics of a hypothetical storm (e.g., wind speed and/or direction, precipitation levels, or other characteristics of the storm). As also described previously, the given ensemble forecast model that is associated with the probabilistic model 156 has defined characteristics (e.g., wind speed, precipitation amount, and affected land area of the geographic region) of the given storm. Therefore, the model generator 154 can delineate the set of inventory data that is associated with the given storm of the ensemble forecast model, and can assign percentage probabilities of failure of the specific characteristics of the given storm of the ensemble forecast model to the set of inventory of the probabilistic model 156. As a result, each of the plurality of iterative probabilistic simulations on the probabilistic model 156 can result in a different outcome based on the different potential failures of the power-providing equipment described by the set of inventory data in response to the characteristics of the storm. Accordingly, by implementing the plurality of iterative probabilistic simulations on the probabilistic model 156 (e.g., ten or more simulations), the simulator system 158 can accommodate different potential scenarios of resulting damage from the storm associated with the respective ensemble forecast model.

The storm damage model control system 150 also includes a statistical impact monitor 160 that is configured to assign a statistical impact value to each of the scenarios corresponding to the respective iterative simulations of the probabilistic model 156 provided by the simulation system 158. The statistical impact value can include one or more quantitative values or metrics that are associated with the predicted storm damage and/or potential efforts associated with recovery from the predicted storm damage. As an example, the statistical impact monitor 160 can determine a repair or maintenance cost associated with a given scenario based on the power-providing equipment that failed in a given one of the iterative probabilistic simulations. The cost can include costs associated with allocation of resources (e.g., personnel, equipment, logistical resources, or any other resources) and/or costs associated with prolonged power outage (e.g., associated with long-term macro-economic societal effects). As another example, the statistical impact monitor 160 can determine a repair or maintenance timeline associated with repairing the power-providing equipment to restore the power to consumers and businesses in the geographic region. As yet another example, the statistical impact monitor 160 can also determine an amount of resources outside of the scope of the power-providing equipment that may be necessary to recover from the storm, such as medical personnel, rescue personnel, or other recovery personnel that may be necessary to recover from the storm effects (e.g., such as necessitating government or neighboring provincial intervention). Because these determinations can be substantially inclusive of all aspects of recovery and can be highly interrelated, the statistical impact monitor 160 can substantially simplify each scenario to a quantitative value that is representative of the potential impact of the storm.

The storm damage model control system 150 also includes a scenario comparator 162 and a plan generator 164. In the example of FIG. 4, the statistical impact monitor 160 provides each of the scenarios, demonstrated as "SCEN", corresponding to each of the respective iterative probabilistic simulations of the probabilistic model 156 to the scenario comparator 162. In response, the scenario comparator 162 can select a given one of the scenarios SCEN based on a predetermined set of criteria to provide to the plan generator 164. As a result, the plan generator 164 can generate an operational level storm damage response plan, demonstrated as "ORL" that corresponds to the operational procedure for responding to the impact of the storm for the respective scenario. As an example, the predetermined set of criteria can correspond to selecting the respective scenario of the set of scenarios based on a "worst case" corresponding to the most severe potential impact, such as by selecting the scenario having the highest statistical impact value. As another example, the predetermined set of criteria can correspond to or include other criteria, such as based on a tiered or weighted importance, that can include cost, time, resources, or other factors. As yet another example, the scenario comparator 162 can be configured to select action plans from multiple scenarios, such as based on failures or likelihoods of failure from selective different scenarios to create an aggregate scenario.

Accordingly, the plan generator 164 can generate the operational level storm damage response plan ORL based on the scenario or aggregate scenario selected by the scenario comparator 162, with the operational level storm damage response plan ORL corresponding to the operational procedure and action plan for recovering from the potential impact of the storm for the selected scenario associated with the respective one of the ensemble forecast models. As an example, the operational level storm damage response plan ORL can correspond to a single operational response level plan, such as the operational response level plan 26 in the example of FIG. 1. For example, the operational level storm damage response plan ORL can include geographic-based resource allocation and inventory repair action plans based on the set of inventory data for the respective ensemble forecast model. However, the operational level storm damage response plan ORL corresponds to only a single one of the ensemble forecast models, and thus only a single potential path of the storm. Because the path of an incoming storm may be difficult to predict, the storm damage model control system 150 can thus generate a operational level storm damage response plan ORL (e.g., an operational level response plan) for each of the ensemble forecast models in an iterative manner. Therefore, the storm damage model control system 150 can generate a probabilistic model 156, implement the iterative probabilistic simulations for the probabilistic model 156, assign a statistical impact value for each of the respective scenarios of the iterative probabilistic simulations, and generate a respective operational level storm damage response plan ORL for each of the ensemble forecast models.

Based on the aggregation of operational level storm damage response plans ORL that are generated by the plan generator 164, the plan generator 164 can also generate an executive level storm damage response plan, demonstrated as "ERL". As an example, the executive level storm damage response plan ERL can be generated based on all of the operational level storm damage response plans ORL, such as to account for any possible storm path of the incoming storm based on the potential impact of each of the respective ensemble forecast models. As an example, the executive level storm damage response plan ERL can include a total estimated resources required and an estimated timeline for providing recovery for affected customer outages resulting from the storm damage impact with respect to the power generator systems and power-providing equipment based on an aggregate impact of the ensemble forecast models (e.g., an aggregation of the operational level storm damage response plans ORL).

For example, similar to as described previously for the scenario comparator 162, the plan generator 164 can select a given one of the operational level storm damage response plans ORL based on a predetermined set of criteria to provide the executive level storm damage response plan ERL. As an example, the predetermined set of criteria can correspond to selecting the respective operational level storm damage response plans ORL corresponding to "worst case" scenario of the set of ensemble forecast models. As another example, the executive level storm damage response plan ERL can be generated based on an aggregation of each of the operational level storm damage response plans ORL.

For example, the plan generator 164 can base the executive level storm damage response plan ERL on percentage probabilities associated with each of the ensemble forecast models (e.g., as provided by the weather forecasting service). Therefore, the percentage probabilities associated with each of the ensemble forecast models can correspond to weights for purposes of determining a predictive impact of each of the operational level storm damage response plans ORL, and thus a predicted impact of the storm based on the respective percentages of likelihood of the ensemble forecast models. As yet another example, the executive level damage response plan ERL can include an overview of each of the ensemble forecast models and/or the respective corresponding operational level storm damage response plans ORL, such that the executive level damage response plan ERL can allow for a change in the selected operational level damage response plan ORL or can be used to select the operational level damage response plan ORL. Accordingly, the executive level storm damage response plan ERL can be generated based on the generated operational level storm damage response plans ORL.

Figure 5:
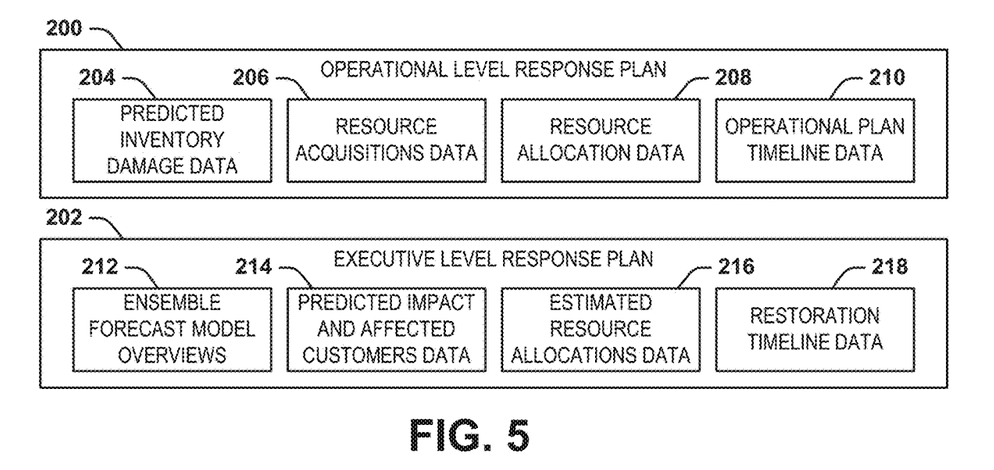
FIG. 5 illustrates an example of storm response plan reports.

FIG. 5 illustrates an example of storm response plan reports. Particularly, the storm response plan reports are demonstrated in the example of FIG. 5 as an operational level damage response plan 200 and an executive level damage response plan 202. The operational level damage response plan 200 and the executive level damage response plan 202 can correspond to the operational level damage response plan ORL and the executive level damage response plan ERL in the example of FIG. 4. Therefore, reference is to be made to the examples of FIGS. 1-4 in the following description of the example of FIG. 5.

The operational level damage response plan 200 includes predicted inventory damage data 204, resource acquisition data 206, resource allocation data 208, and operational plan timeline data 210. The predicted inventory damage data 204 can correspond to a predicted set of the affected power-providing equipment inventory that is likely or predicted to be damaged or destroyed by the storm. For example, the predicted inventory damage data 204 can correspond to the set of inventory that was demonstrated to have failed based on the iterative probabilistic simulations on the probabilistic model 156. Therefore, the predicted inventory damage data 204 can form the basis for repairs that are associated with the operational plan for post-storm restoration.

The resource acquisitions data 206 can correspond to the resources that are needed to fulfill the operational plan for post-storm restoration. As an example, the resource acquisitions data 206 can include power-providing equipment that is necessary to be acquired to fulfill the operational plan, and can include both "spare" power-providing equipment and power-providing equipment that needs to be ascertained (e.g., from vendors, from other provincial or corporate inventory stores, from government aid organizations (e.g., Edison Electric Institute (EEI), the Federal Emergency Management Agency (FEMA)), or other sources). The resource acquisitions data 206 can also include human resources and associated equipment, such as technicians, vehicles and other transportation to provide the technicians, and supporting equipment (e.g., tools for the technicians, food and fresh water for the technicians and/or for displaced people, etc.). The resource acquisitions data 206 can thus define the necessary resources to restore the power generator systems and associated power-providing equipment after the storm damage based on the predicted inventory damage data 204 over the operational plan.

The resource allocation data 208 can correspond to an allocation of the resources that are needed to fulfill the operational plan for post-storm restoration. As an example, the resource allocation data 208 can include an allocation of the power-providing equipment to specific portions and areas of the geographic region, such as to specific power generator systems and/or to specific geographic areas in the geographic region where damage to the power-providing equipment is located. The resource allocation data 208 can also include locations to lodge technicians and associated equipment, as defined by the resource acquisitions data 206, during the storm. As a result, the technicians and associated equipment can begin to implement the operational plan substantially immediately after the storm has passed through the geographic area or has dissipated entirely. The resource allocation data 208 can thus define the manner in which the resources are allocated across the geographic region to restore the power generator systems and associated power-providing equipment after the storm damage based on the resource acquisitions data 206 over the operational plan.

The operational plan timeline data 210 can correspond to an ordered timeline of the operational plan for restoring the power generator systems and associated power-providing equipment after the storm damage. As an example, the operational plan timeline data 210 can include a detailed and ordered timeline as to the repairs to be performed via the allocated resources defined by the resource allocation data 208. For example, certain portions of the power generator systems and the associated power-providing equipment may need to be repaired before other portions of the power generator systems and the associated power-providing equipment to provide efficient and effective restoration after the impact of the storm. As an example, the resource allocation data 208 and the operational plan timeline data 210 can be interrelated as to providing a timeline for the allocation of the resources to the different portions of the geographic region affected by the storm. Therefore, the operational plan timeline data 210 provides the logistical details for restoration of the power generator systems and the associated power-providing equipment in response to the storm damage.

The executive level damage response plan 202 includes ensemble forecast model overviews 212, predicted impact and affected customers data 214, estimated resource allocations data 216, and restoration timeline data 218. The ensemble forecast model overviews 212 can correspond to each of the ensemble forecast models, such that the ensemble forecast model overviews 212 can allow a user to selectively view each of the ensemble forecast models and any associated data. For example, the ensemble forecast model overviews 212 can graphically demonstrate each of the ensemble forecast models, and can include data associated with each of the ensemble forecast models. As another example, the ensemble forecast model overviews 212 can allow a user to selectively view each operational level damage response plan ORL (e.g., a given operational level damage response plan 200) associated with each of the ensemble forecast models. For example, the selected operational level damage response plan 200 can be implemented to populate the data associated with the executive level damage response plan 202, such as to allow selection of a given one of the operational level damage response plans 200 that is to be implemented to restore the power generator systems and/or associated power-providing equipment.

The predicted impact and affected customers data 214 can provide data associated with the predicted damage of the storm. The predicted inventory damage data 204 can correspond to a predicted set of the affected power-providing equipment inventory that is likely or predicted to be damaged or destroyed by the storm. For example, the predicted impact and affected customers data 214 can correspond to an overview of the set of inventory that was demonstrated to have failed based on the iterative probabilistic simulations on the probabilistic model 156. Additionally, the predicted impact and affected customers data 214 can indicate the power customers that are predicted to be affected or most affected by the impact of the storm, such as can form the basis for selection of the operational level damage response plan 200. Therefore, the predicted impact and affected customers data 214 can form the basis for repairs that are associated with the operational plan for post-storm restoration.

The estimated resource allocations data 216 can correspond to an amount and allocation of the resources that are needed to fulfill the operational plan for post-storm restoration. As an example, the estimated resource allocations data 216 can include power-providing equipment that is necessary to fulfill the operational plan, such as based on a comparison of what is needed for the operational plan and what is "on hand". The estimated resource allocations data 216 can also include human resources and associated equipment, such as technicians, vehicles and other transportation to provide the technicians, and supporting equipment (e.g., tools for the technicians, food and fresh water for the technicians and/or for displaced people, etc.). The estimated resource allocations data 216 can thus define the necessary resources to restore the power generator systems and associated power-providing equipment after the storm damage, and can be determinative as to whether external help/mutual assistance (e.g., EEI or from a government emergency relief organization (e.g., FEMA)) is necessary to be contacted to fulfill the operational plan.

The restoration timeline data 218 can correspond to a timeline of the operational plan for restoring the power generator systems and associated power-providing equipment after the storm damage. As an example, the restoration timeline data 218 can include an estimate of a total time for restoration of the power generator systems and/or the power-providing equipment. For example, the restoration timeline data 218 can be used to provide estimates of restoring power to affected geographic areas and the customers that are likely to be affected by power outages caused by the storm. The restoration timeline data 218 can be used for selection of a given one of the operational level damage response plans 200 (e.g., satisfying a timing criterion), and can also be used to inform agencies and customers as to expected power restoration. Therefore, the restoration timeline data 218 provides the predicted timing of restoration of the power generator systems and the associated power-providing equipment in response to the storm damage.

Figure 6:
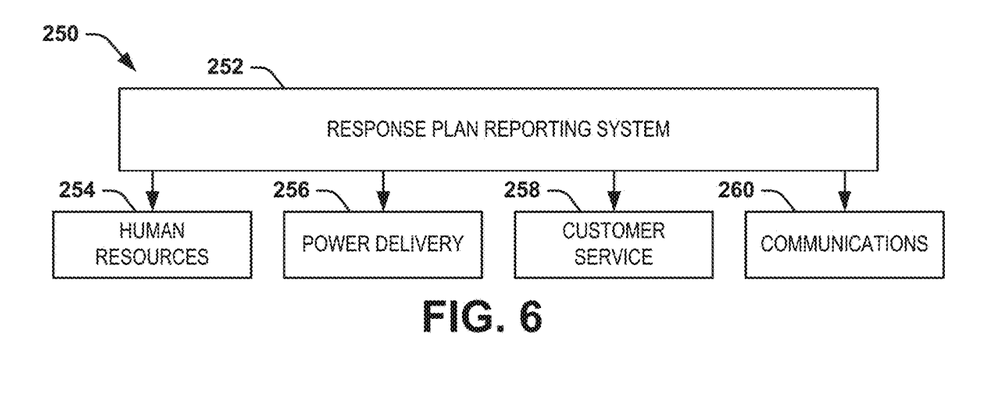
FIG. 6 illustrates an example diagram of storm response plan reporting.

FIG. 6 illustrates an example diagram 250 of storm response plan reporting. The diagram 250 demonstrates a response plan reporting system 252 and a plurality of organizations to which the storm damage response plan(s) are disseminated. As an example, the response plan reporting system 252 can correspond to the response plan reporting system 62 in the example of FIG. 2. Therefore, reference is to be made to the examples of FIGS. 2-5 in the following description of the example of FIG. 6.

The response plan reporting system 252 can provide the storm damage response plan(s) (e.g., the storm damage response plan(s) 52 in the example of FIG. 2, or at least one of the operational level damage response plan 200 and the executive level damage response plan 202 of the example of FIG. 5) to each of the separate organizations. In the example of FIG. 6, the organizations include human resources 254, power delivery 256, customer service 258, and communications 260.

As an example, human resources 254 can implement the storm damage response plan(s) to provide information to employees of the power generator system(s). For example, human resources 254 can provide an indication to employees when to evacuate prior to the incoming storm, such as based on the operational plan timeline (e.g., the operational plan timeline data 210). Human resources 254 can also indicate details to logistics personnel to obtain necessary inventory, and to technicians to provide them with preparation for their efforts to provide restoration after the storm, such as defined in the resource acquisitions data 206 and/or resource allocation data 208. Power delivery 256 can implement the storm damage response plan(s) to provide control of the power generator systems and/or power-providing equipment before and/or after the storm. As an example, power delivery 256 can implement the storm damage response plan(s) to identify protocols with respect to the power generator system(s) and the power-providing equipment to safely disable the respective equipment, and/or to provide an indication at the power generation sources as to when to safely re-enable the power generator system(s).

Customer service 258 can implement the storm damage response plan(s) to communicate the status of the operational plan. For example, customer service 258 can communicate the predicted timeline of the operational plan to potentially affected customers, and can communicate updates to the affected customers during the execution of the operational plan. Additionally, customer service 258 can provide other information to affected customers, such as safety information and/or evacuation information. Communications 260 can implement the storm damage response plan(s) to provide emergency crews to portions of the geographic region that are predicted to be affected, and thus are predicted to require emergency services. Communications 260 can include dispatching and emergency services, and can refer to any of a variety of other organizations within the power generator system(s) organization or outside of the power generator system(s) organization that may require information about the operational plan to restore the damage from the storm.

The disclosure herein thus describes storm damage response system to effectively and efficiently provide power recovery efforts in response to a coming storm, or for a simulated storm to provide preventative maintenance. The storm damage response system described herein, for example, allows for the capability to predetermine the resources that are necessary to fulfill the operational plan for restoring the power generator system(s) (and by extension, the power-providing equipment) after the storm damage. Based on the manner in which the storm damage response plan(s) are generated, the storm damage response plan(s) can be implemented to provide justification for requesting additional resources from external mutual assistance partners (e.g., EEI). Additionally, the storm damage response plan(s) can facilitate pre-staging resources, including technicians and equipment resources, to allow for a faster response and more effective logistical planning for after the storm has passed based on the estimated workload provided by the storm damage response plan(s). Accordingly, by providing the storm damage response plan(s) at both an operational level (based on the iterative probabilistic simulations) and the executive level, the storm damage response system can account for a multitude of different scenarios to estimate the effects and the respective restoration steps at all levels of the power generator system organization.

Figure 7:
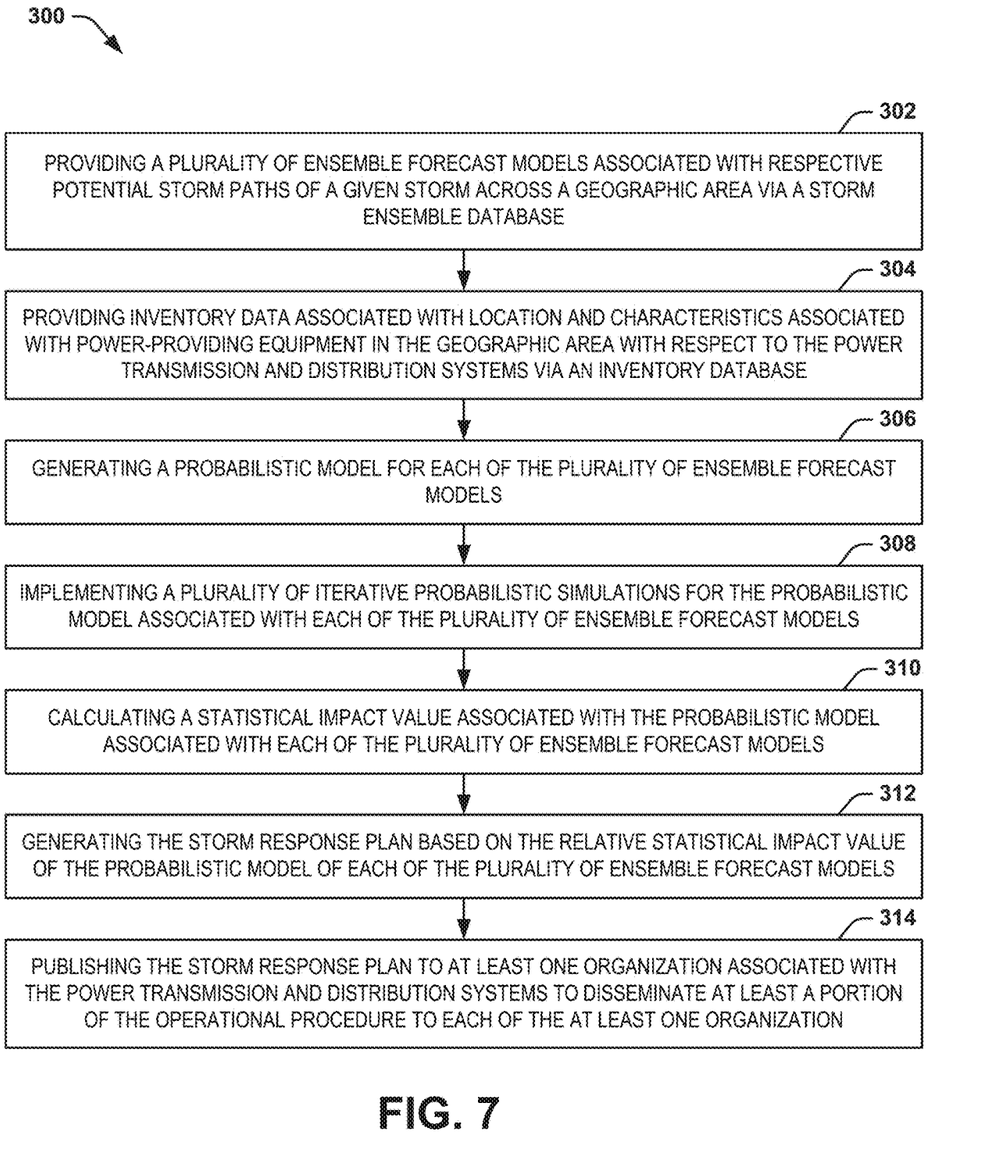
FIG. 7 illustrates an example of a method for generating a storm response plan.

In view of the foregoing structural and functional features described above, methods in accordance with various aspects of the present disclosure will be better appreciated with reference to FIG. 7. While, for purposes of simplicity of explanation, the method of FIG. 7 is shown and described as executing serially, it is to be understood and appreciated that the present disclosure is not limited by the illustrated orders, as some aspects could, in accordance with the present disclosure, occur in different orders and/or concurrently with other aspects from that shown and described herein. Moreover, not all illustrated features may be required to implement method in accordance with an aspect of the present disclosure.

FIG. 7 illustrates a method 300 for generating a storm response plan (e.g., the storm response plan(s) 22) comprising an operational procedure for repairing or maintaining power generator systems (e.g., the power generator system 12) to mitigate storm damage impact. At 302, a plurality of ensemble forecast models (e.g., the ensemble forecast models 106) associated with respective potential storm paths of a given storm (e.g., the storm 24) across a geographic area are provided via a storm ensemble database (e.g., the storm ensemble database 56). At 304, providing inventory data (e.g., the inventory data INV) associated with location and characteristics associated with power-providing equipment in the geographic area with respect to the power generator systems via an inventory database (e.g., the inventory database 54). At 306, a probabilistic model (e.g., the probabilistic model 156) is generated for each of the plurality of ensemble forecast models. The probabilistic model includes probabilistic data associated with operational failure of the power-providing equipment, as defined by the inventory data, based on a portion of the geographic area that is associated with the potential storm path of the respective one of the plurality of ensemble forecast models. At 308, a plurality of iterative probabilistic simulations are implemented for the probabilistic model associated with each of the plurality of ensemble forecast models (e.g., via the simulation system 158). At 310, a statistical impact value associated with the probabilistic model associated with each of the plurality of ensemble forecast models is calculated (e.g., via the statistical impact monitor 160). At 312, the storm response plan is generated based on the relative statistical impact value of the probabilistic model of each of the plurality of ensemble forecast models (e.g., via the plan generator 164). At 314, the storm response plan is published to at least one organization (e.g., the organizations 254, 256, 258, and 260) associated with the power generator systems to disseminate at least a portion of the operational procedure to each of the at least one organization.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:
1. A storm damage response system comprising:
a storm ensemble database configured to store a plurality of ensemble forecast models associated with respective potential storm paths of a given storm across a geographic area, as provided from and updated by a weather forecasting service;
an inventory database configured to store inventory data associated with location and characteristics associated with power-providing equipment in the geographic area with respect to power generator systems; and
a storm damage model control system configured to implement a storm damage model algorithm to generate a predictive storm response plan comprising an operational procedure for repairing or maintaining the power generator systems to mitigate storm damage impact, the storm damage model algorithm being configured to generate a probabilistic model associated with the operational failure of the power-providing equipment relative to time, cost, resource availability, and storm severity constraints for each of the plurality of ensemble forecast models and to calculate a statistical impact value indicative of a cost-based resource allocation estimate associated with the probabilistic model based on an aggregate of a plurality of iterative probabilistic simulations for the probabilistic model associated with the respective one of the plurality of ensemble forecast models, the storm damage model control system comprising a scenario comparator configured to select the probabilistic model associated with a respective one of the plurality of ensemble forecast models based on the relative statistical impact value of the probabilistic model of each of the plurality of ensemble forecast models to generate the predictive storm response plan.

2. The system of claim 1, further comprising a response plan reporting system configured to publish the predictive storm response plan to a plurality of organizations associated with the power generator systems to disseminate at least a portion of the operational procedure to each of the plurality of organizations.

3. The system of claim 2, wherein the plurality of organizations comprises at least one of human resources, power delivery, and customer service associated with the power generator systems.

4. The system of claim 1, wherein the storm ensemble database is configured to store the plurality of ensemble forecast models as at least one of simulated and historical storms associated with the geographic area to provide the predictive storm response plan as a prophylactic maintenance plan for the power generator systems.

5. The system of claim 1, wherein the storm damage model control system comprises a model generator configured to generate the probabilistic model associated with each of the plurality of ensemble forecast models, the probabilistic model comprising probabilistic data associated with operational failure of the power-providing equipment, as defined by the inventory data, based on a portion of the geographic area that is associated with the potential storm path of the respective one of the plurality of ensemble forecast models.

6. The system of claim 5, wherein the storm damage model control system is further configured to assign a predetermined percentage of failure of each of at least a portion of the power-providing equipment over a range of storm characteristics based on maintenance data of the power-providing equipment associated with the inventory data, wherein the maintenance data comprises information corresponding to at least one of when the power-providing equipment was last repaired or maintained, a current state of repair, and a proximity or relationship with features of the geographic area, wherein the probabilistic data is generated based on the predetermined percentage of failure of each of the at least a portion of the power-providing equipment with respect to the given storm.

7. The system of claim 5, wherein the storm damage model control system further comprises a simulator system configured to implement the plurality of iterative probabilistic simulations on the probabilistic model associated with each of the plurality of ensemble forecast models to generate the statistical impact value for the respective probabilistic model based on the plurality of iterative probabilistic simulations.

8. The system of claim 7, wherein the storm damage model control system further comprises
a plan generator configured to generate the predictive storm response plan based on the inventory data associated with the selected probabilistic model.

9. The system of claim 8, wherein the predictive storm response plan comprises:
an operational level response plan associated with the selected probabilistic model, the operational response level plan comprising geographic-based resource allocation and inventory repair action plans based on the inventory data and the respective one of the plurality of ensemble forecast models; and
an executive level response plan comprising a total estimated resources and an estimated timeline for providing recovery for affected customer outages resulting from the storm damage impact with respect to the power generator systems based on an aggregate impact scenario associated with the plurality of ensemble forecast models.

10. A method for generating a predictive storm response plan comprising an operational procedure for repairing or maintaining power generator systems to mitigate storm damage impact, the method comprising:

providing a plurality of ensemble forecast models associated with respective potential storm paths of a given storm across a geographic area via a storm ensemble database based on updates from a weather forecasting service;
providing inventory data associated with location and characteristics associated with power-providing equipment in the geographic area with respect to the power generator systems via an inventory database;
generating a probabilistic model for each of the plurality of ensemble forecast models, the probabilistic model comprising probabilistic data associated with operational failure of the power-providing equipment relative to time, cost, resource availability, and storm severity constraints, as defined by the inventory data, based on a portion of the geographic area that is associated with the potential storm path of the respective one of the plurality of ensemble forecast models;
implementing a plurality of iterative probabilistic simulations for the probabilistic model associated with each of the plurality of ensemble forecast models;
calculating a statistical impact value associated with the probabilistic model associated with each of the plurality of ensemble forecast models, the statistical impact value being indicative of a cost-based resource allocation estimate based on the probabilistic data;
selecting the probabilistic model associated with a respective one of the plurality of ensemble forecast models based on the relative statistical impact value of the probabilistic model of each of the plurality of ensemble forecast models to generate the predictive storm response plan; and
publishing the predictive storm response plan to at least one organization associated with the power generator systems to disseminate at least a portion of the operational procedure to each of the at least one organization.

11. The method of claim 10, wherein generating the storm recover plan comprises:
generating an operational level response plan comprising geographic-based resource allocation and inventory repair action plans; and
generating an executive level response plan comprising a total resource cost and a timeline for providing recovery for affected customer outages resulting from the storm damage impact with respect to the power generator systems.

12. The method of claim 10, wherein providing the plurality of ensemble forecast models comprises at least one of generating simulated storms and providing data associated with historical storms associated with the geographic area to provide the predictive storm response plan as a prophylactic maintenance plan for the power generator systems.

13. The method of claim 10, further comprising assigning a predetermined percentage of failure of each of at least a portion of the power-providing equipment over a range of storm characteristics based on maintenance data of the power-providing equipment associated with the inventory data, wherein the maintenance data comprises information corresponding to at least one of when the power-providing equipment was last repaired or maintained, a current state of repair, and a proximity or relationship with features of the geographic area, wherein generating the probabilistic model comprises generating the probabilistic data based on the predetermined percentage of failure of each of the at least a portion of the power-providing equipment with respect to the given storm.

14. A storm damage response system comprising:
a storm ensemble database configured to store a plurality of ensemble forecast models associated with respective potential storm paths of a given storm across a geographic area;
an inventory database configured to store inventory data associated with location and characteristics associated with power-providing equipment in the geographic area with respect to power generator systems;
a storm damage model control system configured to implement a storm damage model algorithm to generate a predictive storm response plan comprising an operational procedure for repairing or maintaining the power generator systems to mitigate storm damage impact, the storm damage model algorithm being configured to generate a probabilistic model associated with the operational failure of the power-providing equipment relative to time, cost, resource availability, and storm severity constraints for each of the plurality of ensemble forecast models based on a predetermined percentage of failure of each of the at least a portion of the power-providing equipment with respect to the given storm based on maintenance data corresponding to at least one of when the power-providing equipment was last repaired or maintained, a current state of repair, and a proximity or relationship with features of the geographic area, and to calculate a statistical impact value indicative of a cost-based resource allocation estimate associated with the probabilistic model based on an aggregate of a plurality of iterative probabilistic simulations for the probabilistic model associated with the respective one of the plurality of ensemble forecast models, the storm damage model control system comprising a scenario comparator configured to select the probabilistic model associated with a respective one of the plurality of ensemble forecast models based on the relative statistical impact value of the probabilistic model of each of the plurality of ensemble forecast models to generate the predictive storm response plan, the predictive storm response plan comprising an operational level response plan comprising geographic-based resource allocation and inventory repair action plans and an executive level response plan comprising a total resource cost and a timeline for providing recovery for affected customer outages resulting from the storm damage impact with respect to the power generator systems.

15. The system of claim 14, further comprising a response plan reporting system configured to publish the predictive storm response plan to a plurality of organizations associated with the power generator systems to disseminate at least a portion of the operational procedure to each of the plurality of organizations.

16. The system of claim 14, wherein the storm ensemble database is configured to store the plurality of ensemble forecast models as at least one of simulated and historical storms associated with the geographic area to provide the predictive storm response plan as a prophylactic maintenance plan for the power generator systems.

17. The system of claim 14, wherein the storm damage model control system comprises a model generator configured to generate the probabilistic model associated with each of the plurality of ensemble forecast models, the probabilistic model comprising probabilistic data associated with operational failure of the power-providing equipment, as defined by the inventory data, based on a portion of the geographic area that is associated with the potential storm path of the respective one of the plurality of ensemble forecast models.

18. The system of claim 1, wherein the scenario comparator is configured to select the probabilistic model based on a predetermined set of criteria, wherein the predetermined set of criteria comprises a weighted importance associated with at least one of the time, the cost, and the resource availability associated with the statistical impact value.

* * * * *